(12) United States Patent
Kalnitsky et al.

(10) Patent No.: US 12,255,133 B2
(45) Date of Patent: Mar. 18, 2025

(54) ELECTRICAL FUSE (E-FUSE) ONE-TIME PROGRAMMABLE (OTP) DEVICE AND MANUFACTURING METHOD THEREOF

(71) Applicant: TAIWAN SEMICONDUCTOR MANUFACTURING COMPANY, LTD., Hsinchu (TW)

(72) Inventors: Alexander Kalnitsky, San Francisco, CA (US); Wei-Cheng Wu, Hsinchu County (TW); Harry-Hak-Lay Chuang, Hsinchu County (TW); Chia Wen Liang, Hsinchu County (TW); Li-Feng Teng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 493 days.

(21) Appl. No.: 17/460,211

(22) Filed: Aug. 28, 2021

(65) Prior Publication Data

US 2023/0067962 A1 Mar. 2, 2023

(51) Int. Cl.
*H01L 23/522* (2006.01)
*H01L 21/768* (2006.01)
*H01L 23/525* (2006.01)
*H01L 29/66* (2006.01)

(52) U.S. Cl.
CPC .... *H01L 23/5226* (2013.01); *H01L 21/76805* (2013.01); *H01L 21/76834* (2013.01); *H01L 23/5256* (2013.01); *H01L 29/66545* (2013.01)

(58) Field of Classification Search
CPC ............ H01L 23/5226; H01L 23/5256; H01L 21/76805; H01L 21/76834
See application file for complete search history.

(56) References Cited

U.S. PATENT DOCUMENTS

| | | | | |
|---|---|---|---|---|
| 10,818,595 | B2 * | 10/2020 | Ho | H01L 29/401 |
| 2010/0059823 | A1 * | 3/2010 | Chung | H01L 27/0629 257/E27.071 |
| 2011/0101460 | A1 * | 5/2011 | Heinrich | H01L 29/7843 438/585 |
| 2011/0147853 | A1 * | 6/2011 | Lin | H01L 23/5256 257/E21.627 |
| 2011/0241117 | A1 * | 10/2011 | Wei | H01L 27/0629 257/E21.409 |
| 2014/0319651 | A1 * | 10/2014 | Wu | H01L 23/5256 257/529 |

* cited by examiner

*Primary Examiner* — Britt D Hanley
*Assistant Examiner* — Vicki B. Booker
(74) *Attorney, Agent, or Firm* — Maschoff Brennan

(57) ABSTRACT

A semiconductor device includes a substrate, an isolation structure, a conductive structure, and a first contact structure. The isolation structure is disposed in the substrate. The conductive structure is disposed on the isolation structure. The conductive structure extends upwards from the isolation structure, in which the first contact structure has a top portion on the conductive structure and a bottom portion in contact with the isolation structure.

20 Claims, 13 Drawing Sheets

ELECTRICAL FUSE (E-FUSE) ONE-TIME PROGRAMMABLE (OTP) DEVICE AND MANUFACTURING METHOD THEREOF

BACKGROUND

Data storage devices may be classified into two categories, volatile memory devices and non-volatile memory devices. The volatile memory devices that have the information stored in a particular storage element, and the information is lost instantly when the power is removed from a circuit. In contrast to the volatile memory devices, the information of the nonvolatile memory devices is preserved even with the power removed. In regards to the nonvolatile memory devices, some designs allow multiple programming, while other designs allow one-time programming. Typically, the manufacturing techniques used to form nonvolatile memory devices are quite different from a standard logic process, which dramatically increases the complexity and chip size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
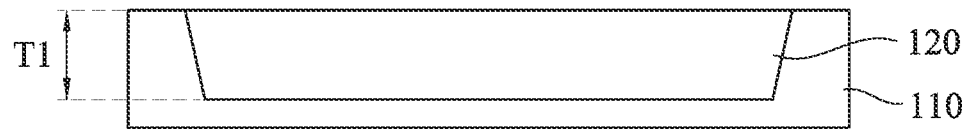
FIG. 1 to FIG. 9 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

An electrical fuse (e-fuse) one-time programmable (OTP) device uses a fuse element connected to a programming transistor. By selectively blowing fuses within an integrated circuit, which has multiple potential uses, a generic integrated circuit design may be economically manufactured and adapted to a variety of customer uses. Some embodiments of the present disclosure relate to a novelty e-fuse one-time programming element including a contact structure extending into an isolation structure. With such configuration, retention and read disturb of the e-fuse one-time programmable device at high temperature can be improved.

FIG. 1 to FIG. 9 illustrate a method for manufacturing a semiconductor device at various stages in accordance with some embodiments of the present disclosure. Reference is made to FIG. 1. A substrate 110 is provided. In some embodiments, the substrate 110 may include silicon (Si). Alternatively, the substrate 110 may include germanium (Ge), silicon germanium (SiGe), gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

An isolation structure 120 is formed in the substrate 110. In some embodiments, the isolation structure 120 is shallow trench isolation (STI). The formation of the isolation structure 120 may include etching a trench in the substrate 110 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation structure 120 may be created using a process sequence such as: growing a pad oxide, forming a low pressure chemical vapor deposition (LPCVD)

nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers. In some embodiments, the isolation structure 120 has a thickness T1 in a range of about 200 nanometers (nm) to about 300 nm. For example, the thickness T1 of the isolation structure 120 is about 250 nm.

Figure 2:
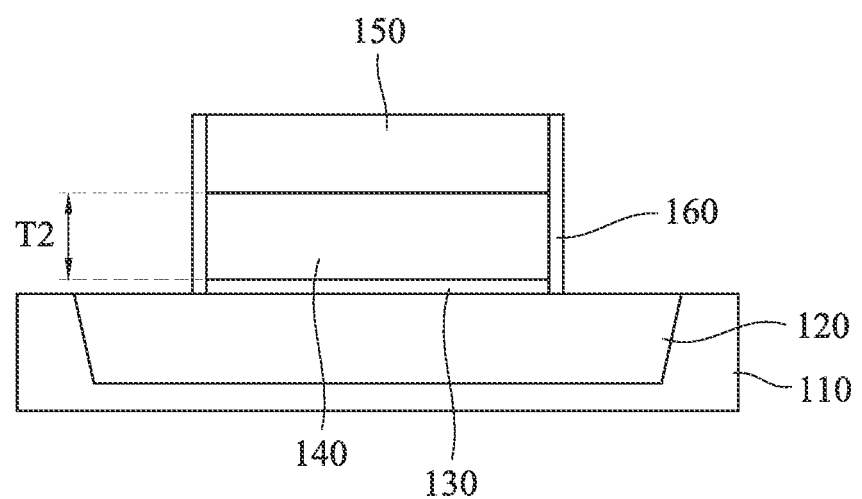

Reference is made to FIG. 2. A dielectric structure 130 is formed over the isolation structure 120. In some embodiments, the dielectric structure 130 may include silicon dioxide, silicon nitride, a high-κ dielectric material or other suitable material. In various examples, the dielectric structure 130 may be deposited by an ALD process, a CVD process, a subatmospheric CVD (SACVD) process, a flowable CVD process, a PVD process, or other suitable process.

Subsequently, a conductive structure 140 is formed over the dielectric structure 130. A hard mask layer 150 is formed over the conductive structure 140. In some embodiments, a dielectric layer (not shown) is formed over the isolation structure 120 and the substrate 110, a conductive layer (not shown) is formed over the dielectric layer, and the hard mask layer 150 is formed over the conductive layer. The conductive layer is etched to form the conductive structure 140 using the hard mask layer 150 as an etch mask. Further, the dielectric layer is etched to form the dielectric structure 130 using the hard mask layer 150 and the conductive structure 140 as the etch masks. In some embodiments, the dielectric structure 130 and the conductive structure 140 are formed by using one etching process. In some other embodiments, the dielectric structure 130 and the conductive structure 140 are formed by using different etching process. In some embodiments, the conductive structure 140 has a thickness T2 in a range of about 20 nanometers (nm) to about 100 nm. In some embodiments, the conductive structure 140 is made of metals, semiconductive materials (e.g., polycrystalline-silicon (poly-Si), poly-crystalline silicon-germanium (poly-SiGe)), or other suitable materials. The hard mask layer 150 may be made of silicon nitride or other suitable materials. In some embodiments, the hard mask layer 150 is a resist and is formed by a process that includes spin-coating.

Thereafter, first spacer structures 160 are formed at least on opposite sidewalls of the hard mask layer 150, the conductive structure 140, and the dielectric structure 130. The first spacer structures 160 may include seal spacers. The first spacer structures 160 may include one or more dielectric materials, such as silicon oxide, silicon nitride, silicon oxynitride, SiCN, $SiC_xO_yN_z$, or combinations thereof. The first spacer structures 160 may be formed using a deposition method, such as plasma enhanced chemical vapor deposition (PECVD), low-pressure chemical vapor deposition (LPCVD), sub-atmospheric chemical vapor deposition (SACVD), or the like. The formation of the first spacer structures 160 may include blanket forming spacer layers and then performing etching operations to remove the horizontal portions of the spacer layers. The remaining vertical portions of the spacer layers form the first spacer structures 160.

Figure 3:
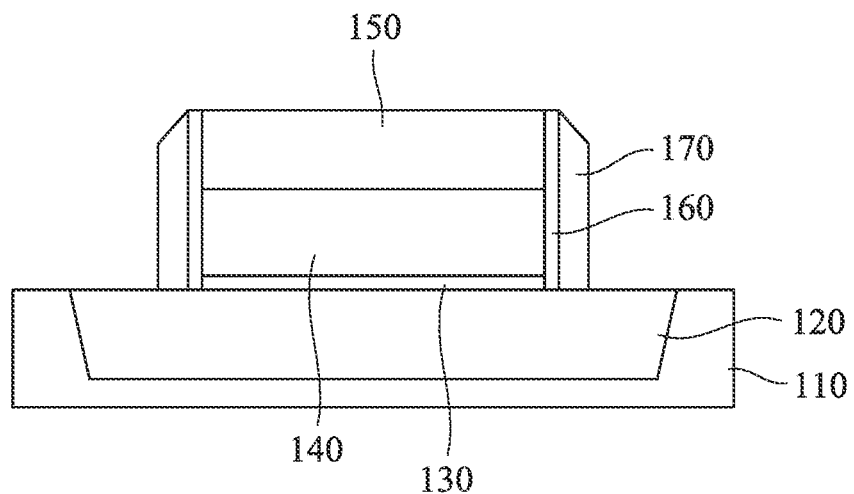

Reference is made to FIG. 3. Second spacer structures 170 are formed on opposite sidewalls of the first spacer structures 160. The second spacer structures 170 may include main spacers. The second spacer structures 170 may include one or more dielectric materials, such as silicon oxide, silicon nitride, silicon oxynitride, SiCN, $SiC_xO_yN_z$, or combinations thereof. The second spacer structures 170 may be formed using a deposition method, such as plasma enhanced chemical vapor deposition (PECVD), low-pressure chemical vapor deposition (LPCVD), sub-atmospheric chemical vapor deposition (SACVD), or the like. The formation of the second spacer structures 170 may include blanket forming spacer layers and then performing etching operations to remove the horizontal portions of the spacer layers. The remaining vertical portions of the spacer layers form the second spacer structures 170. In some embodiments, the first spacer structures 160 and the second spacer structures 170 are made of the same or different materials. For example, the first spacer structures 160 are made of nitride, and the second spacer structures 170 are made of nitride. In some embodiments, the first spacer structures 160 have a profile different from that of the second spacer structures 170.

Figure 4:
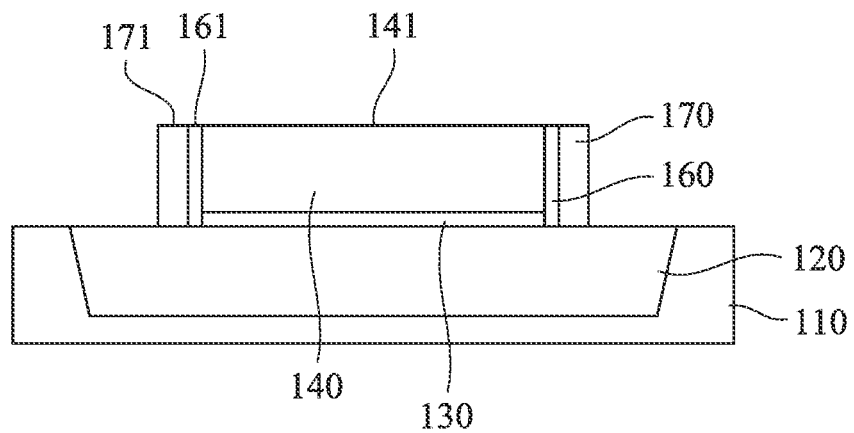

Reference is made to FIG. 4. Top portions of the first spacer structures 160 and the second spacer structures 170 may be etched back such that top surfaces 161 of the first spacer structures 160 and top surfaces 171 of the second spacer structures 170 are substantially coplanar with a top surface 141 of the conductive structure 140. In some embodiments, the top portions of the first spacer structures 160 and the second spacer structures 170 are etched by using a wet etching, a dry etching, an atomic layer etching (ALE), a reactive ion etching, or other etching back techniques. In some embodiments, since the top portions of the first spacer structures 160 and the second spacer structures 170 are removed, the first spacer structures 160 and the second spacer structures 170 have similar profile.

Thereafter, the hard mask layer 150 is removed to expose the conductive structure 140. In some embodiments, removing the hard mask layer 150 is performed by using a resist strip process, such as an ashing process, and etching process, or other suitable processes.

Figure 5:
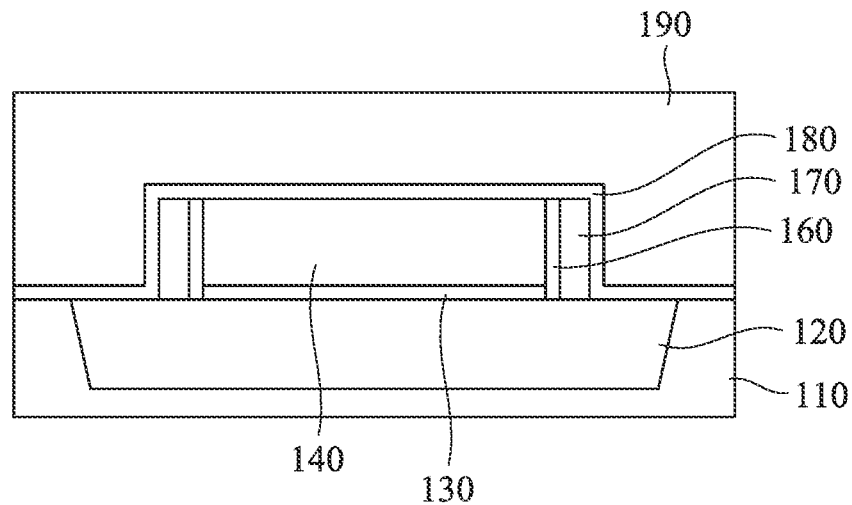

Reference is made to FIG. 5. A contact etch stop layer (CESL) 180 is conformally formed over the structure of FIG. 4. In some embodiments, the CESL 180 is conformally formed over the substrate 110, the isolation structure 120, the second spacer structures 170, the first spacer structures 160, and the conductive structure 140. In some embodiments, the CESL 180 can be a stressed layer or layers. In some embodiments, the CESL 180 has a tensile stress and is formed of $Si_3N_4$. In some other embodiments, the CESL 180 includes materials such as oxynitrides. In yet some other embodiments, the CESL 180 may have a composite structure including a plurality of layers, such as a silicon nitride layer overlying a silicon oxide layer. The CESL 180 can be formed using plasma enhanced CVD (PECVD), however, other suitable methods, such as low pressure CVD (LPCVD), atomic layer deposition (ALD), and the like, can also be used.

After the CESL 180 is formed, a first interlayer dielectric (ILD) 190 is then formed on the CESL 180. The first ILD 190 may be formed by chemical vapor deposition (CVD), high-density plasma CVD, spin-on, sputtering, or other suitable methods. In some embodiments, the first ILD 190 includes silicon oxide, phosphosilicate glass (PSG), borophosphosilicate glass (BPSG), fluorinated silicate glass (FSG), or other suitable materials. In some other embodiments, the first ILD 190 may include silicon oxy-nitride, silicon nitride, compounds including Si, O, C and/or H (e.g., silicon oxide, SiCOH and SiOC), a low-k material, or organic materials (e.g., polymers).

Figure 6:
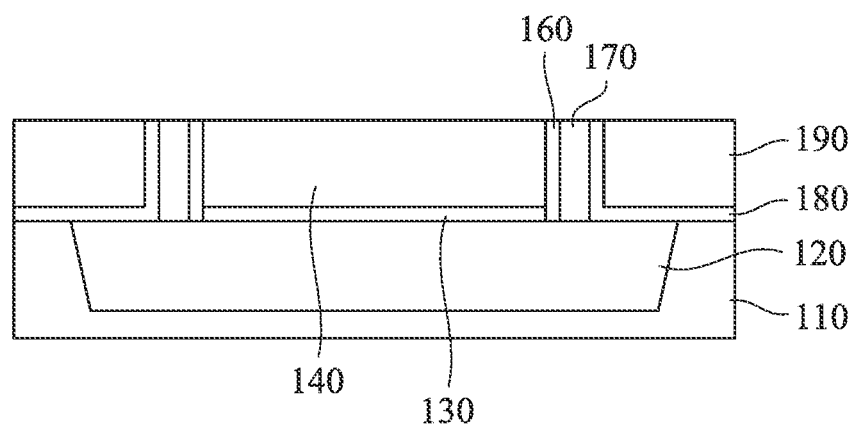

Reference is made to FIG. 5 and FIG. 6. A planarization process is performed to remove portions of the CESL 180 and the first ILD 190 such that the conductive structure 140 is exposed. As a result, the CESL 180 is on sidewalls of the second spacer structures 170 and spaced apart from the first spacer structures 160. In some embodiments, the planarization process is a chemical mechanical planarization (CMP) process.

Figure 7:
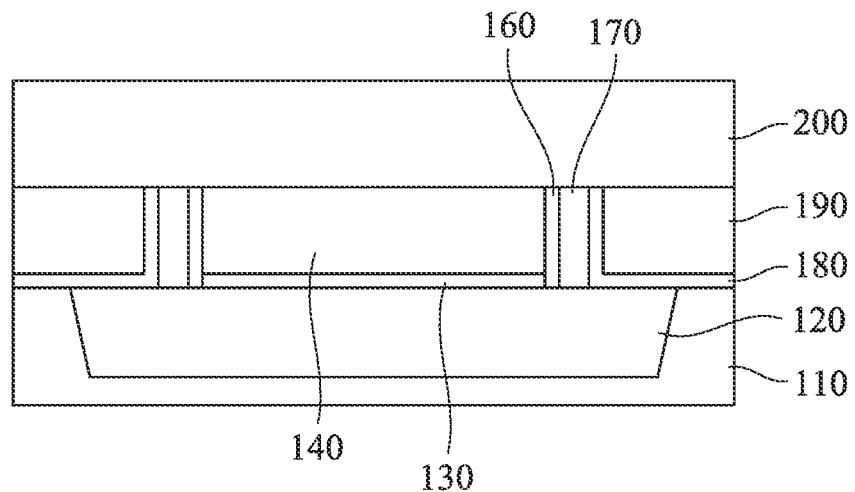

Reference is made to FIG. 7. A second ILD 200 is formed over the structure of FIG. 6. In other words, the second ILD 200 is formed over the conductive structure 140, the first spacer structures 160, the second spacer structures 170, the CESL 180, and the first ILD 190. The second ILD 200 may be formed by chemical vapor deposition (CVD), high-density plasma CVD, spin-on, sputtering, or other suitable methods. In some embodiments, the second ILD 200 includes silicon oxide, phosphosilicate glass (PSG), borophosphosilicate glass (BPSG), fluorinated silicate glass (FSG), or other suitable materials. In some other embodiments, the second ILD 200 may include silicon oxy-nitride, silicon nitride, compounds including Si, O, C and/or H (e.g., silicon oxide, SiCOH and SiOC), a low-k material, or organic materials (e.g., polymers).

Figure 8:
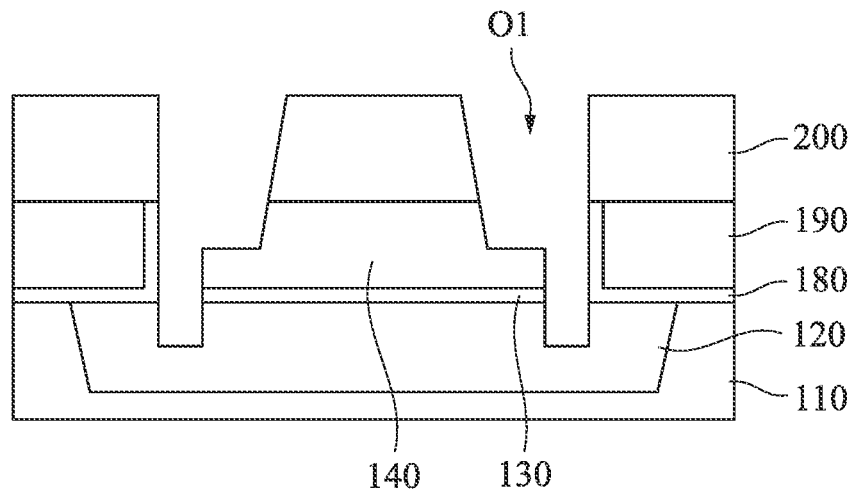

Reference is made to FIG. 8. An etching process is performed to form at least one opening O1 between the conductive structure 140 and the CESL 180 such that portions of the isolation structure 120, the dielectric structure 130, the conductive structure 140, and the second ILD 200 are removed. In some embodiments, the first spacer structures 160 and the second spacer structures 170 are removed such that the CESL 180 is exposed through the opening O1. In some other embodiments, the first spacer structures 160 and a portion of the second spacer structures 170 are removed, while leaving the other portions of the second spacer structures 170 remained.

The conductive structure 140 has a material (e.g., polysilicon) that different from the first spacer structures 160 and the second spacer structures 170 (e.g., dielectric materials), thus resulting in different etch selectivity between the conductive structure 140 and the first and second spacer structures 160 and 170. Due to the etching selectivity between the conductive structure 140 and the first and second spacer structures 160 and 170, a depth of the opening O1 in the conductive structure 140 is shallow than a depth of the opening O1 in the first and second spacer structures 160 and 170. Further, the opening O1 passes through the first and second spacer structures 160 and 170 to the isolation structure 120.

In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Figure 9:
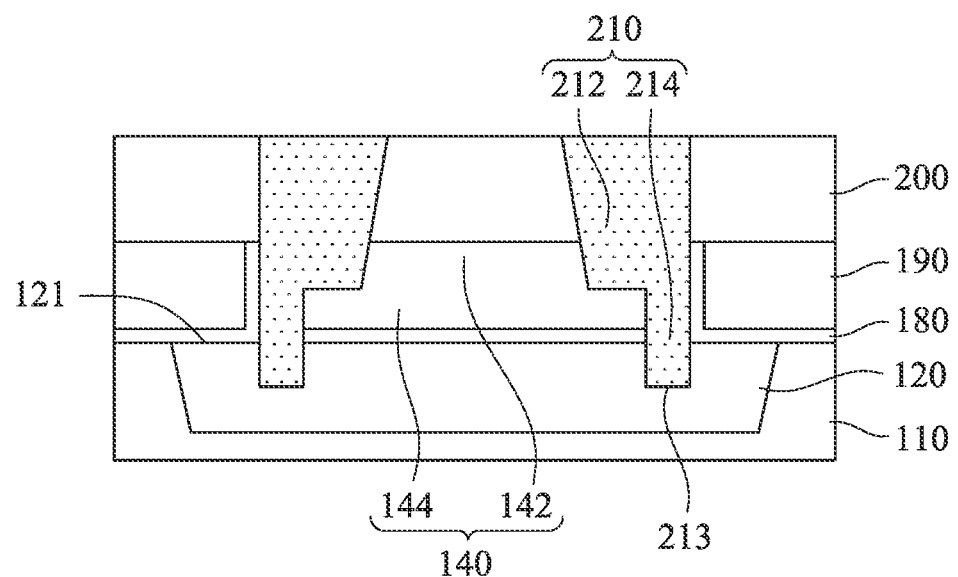
Figure 10:
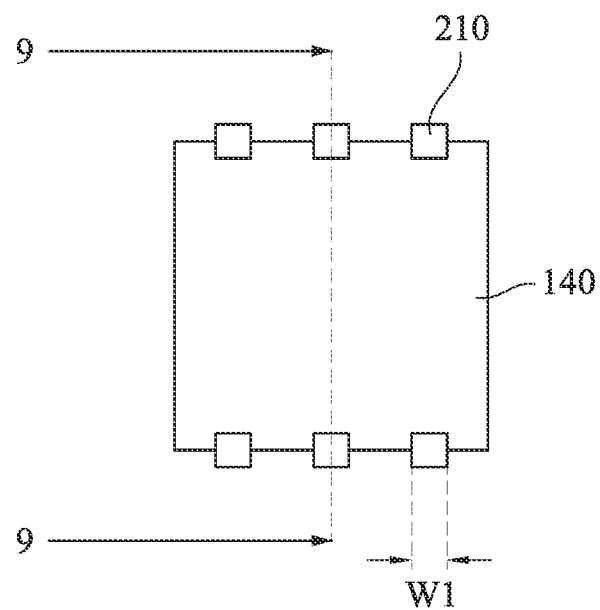
FIG. 10 is a top view of the semiconductor device in FIG. 9.

Reference is made to FIG. 8 to FIG. 10. FIG. 10 is a top view of the semiconductor device in FIG. 9, in which the second ILD 200 in FIG. 10 is omitted for clarity. In other words, FIG. 9 is a cross-sectional view taking along line 9-9 of FIG. 10. A conductive material is filled in the opening O1 to form a contact structure 210. The contact structure 210 is electrically connected to the conductive structure 140. In some embodiments, the contact structure 210 may be made of metal, such as W, Co, Ru, Al, Cu, or other suitable materials. After the deposition of the contact structure 210, a planarization process, such as a chemical mechanical planarization (CMP) process, may be then performed to remove excess conductive material outside the opening O1. In some embodiments, the contact structure 210 extends upwards from the isolation structure 120 and is formed in the isolation structure 120 and the second ILD 200. The contact structure 210 has a top portion 212 in contact with the second ILD 200 and the bottom portion 214 in contact with the dielectric structure 130 and the isolation structure 120. As such, the contact area between the contact structure 210 and the conductive structure 140 can be increased and thus the contact resistance between the contact structure 210 and the conductive structure 140 can be decreased, thereby improving the performance of the semiconductor device. For example, low programming and read current of the one-time programming element can be achieved. Further, in this case, since the conductive structure 140 is made of semiconductive materials, which is stable at high temperature, the reliability performance of the one-time programming element is improved.

In some embodiments, a width the top portion 212 of the contact structure 210 is greater than a width of the bottom portion 214 of the contact structure 210. In some embodiments, an area of the top portion 212 of the contact structure 210 is greater than an area of the bottom portion 214 of the contact structure 210.

In some embodiments, since the first spacer structures 160 and the second spacer structures 170 (see FIG. 7) are removed by the etching process, the contact structure 210 is in contact with the CESL 180.

In some embodiments, the semiconductor device in FIG. 9 and FIG. 10 includes the substrate 110, the isolation structure 120, the conductive structure 140, and the contact structure 210. The isolation structure 120 is disposed/embedded in the substrate 110. The conductive structure 140 is disposed on the isolation structure 120. The contact structure 210 extends upwards from the isolation structure 120.

In some embodiments, a top surface 121 of the isolation structure 120 is substantially coplanar with a top surface of the substrate 110. In some embodiments, the conductive structure 140 has a top portion 142 and a bottom portion 144 between two of the contact structures 210. A width of the top portion 142 is smaller than a width of the bottom portion 144. In some embodiments, the contact structure 210 has a top portion 212 on the conductive structure 140 and a bottom portion 214 in the isolation structure 120. The top portion 212 of the contact structure 210 has a different profile from that of the bottom portion 214 of the contact structure 210. For example, the top portion 212 of the contact structure 210 has a trapezoid profile, while the bottom portion 214 of the contact structure 210 has a substantially rectangle profile. A width of the top portion 212 of the contact structure 210 is greater than a width of the bottom portion 214 of the contact structure 210. The bottom portion 214 and the top portion 212 of the contact structure 210 are in contact with the bottom portion 144 and the top portion of the conductive structure 140, respectively. In some embodiments, a bottom surface 213 of the contact structure 210 is lower than the top surface 121 of the isolation structure 120.

In some embodiments, the contact structure 210 and the conductive structure 140 may be referred as a fuse structure. Since the configuration of the fuse structure, the high fail rate problem can be improved.

In some embodiments, the conductive structure 140 is made of a semiconductor material and the conductive structure 140 is in direct contact with the contact structure 210. As such, the diffuse problem (e.g., between a metal and the contact structure 210) can be improved.

In some embodiments, the semiconductor device further includes the dielectric structure 130 between the conductive structure 140 and the isolation structure 120. The conductive structure 140 overlaps with the dielectric structure 130. Specifically, a vertical projection of the conductive structure 140 on the isolation structure 120 overlaps with a vertical projection of the dielectric structure 130 on the isolation structure 120. In some embodiments, the bottom portion 214 of the contact structure 210 is in contact with the dielectric structure 130 and the top portion 212 of the contact structure 210 is spaced apart from the dielectric structure 130.

In some embodiments, the semiconductor device further includes the CESL 180 on the top surface 121 of the isolation structure. The CESL 180 is in contact with the contact structure 210. The CESL 180 is separated from the conductive structure 140 by the contact structure 210 or the first and second spacer structures 160 and 170.

In some embodiments, the semiconductor device further includes the first ILD 190 on the CESL 180. A top surface of first ILD 190 is substantially coplanar with a top surface of the conductive structure 140. In some embodiments, the semiconductor device further includes the second ILD 200 on the conductive structure 140 and the first ILD 190. The second ILD 200 surrounds the top portion 212 of the contact structure 210. A top surface of the second ILD 200 is substantially coplanar with a top surface of the contact structure 210.

Figure 11:
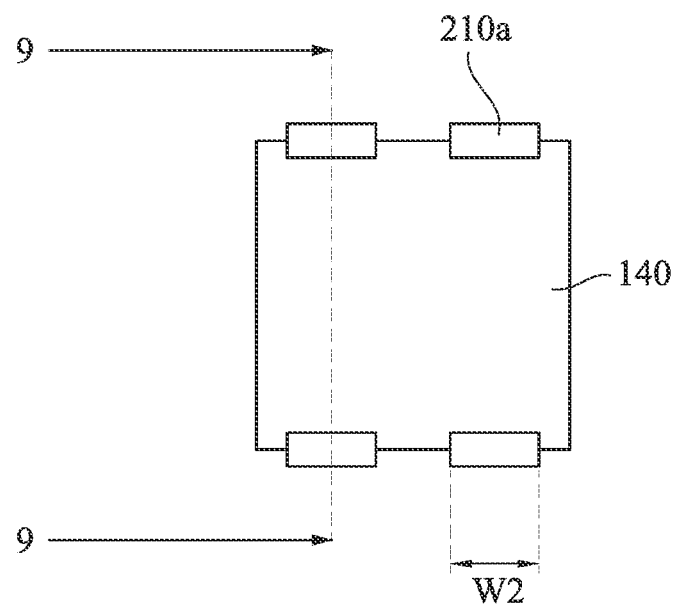
FIG. 11 is a top view of a semiconductor device in accordance with some embodiments of the present disclosure.

Reference is made to FIG. 9 and FIG. 11. FIG. 11 is a top view of a semiconductor device in accordance with some embodiments of the present disclosure. It is noted that the cross-sectional view taking along line 9-9 of FIG. 11 is similar to FIG. 9, and configurations and materials of the conductive structure 140 in FIG. 11 are similar to that of the conductive structure 140 in FIG. 9 and FIG. 10, and the descriptions thereof are not repeated hereinafter. As shown in FIG. 11, a contact structure 210a on the conductive structure 140 has a width W2 greater than a width W1 of the contact structure 210 in FIG. 10. In some embodiments, the width W2 of the contact structure 210a is in a range of about 40 nm to about 150 nm. As such, the contact resistance between the contact structure 210a and the conductive structure 140 can be improved.

Figure 12:
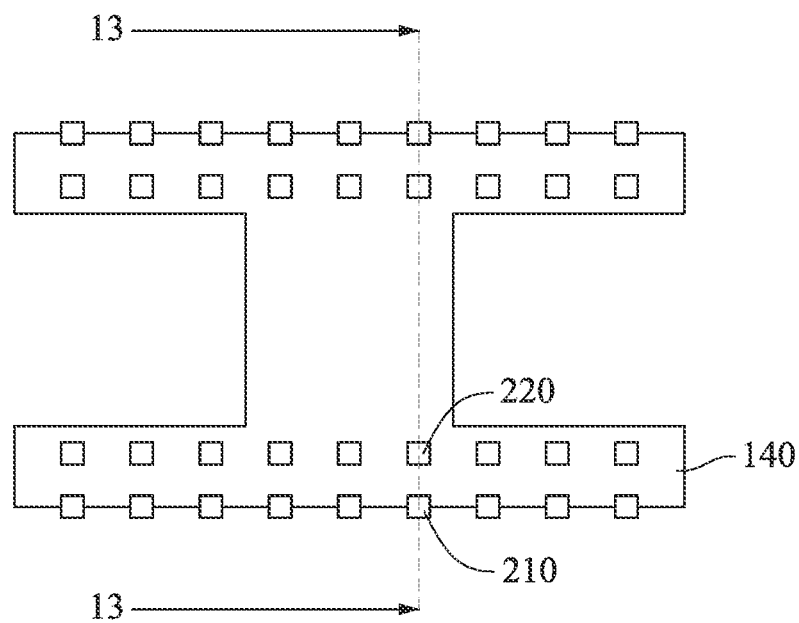
FIG. 12 is a top view of a semiconductor device in accordance with some embodiments of the present disclosure.
Figure 13:
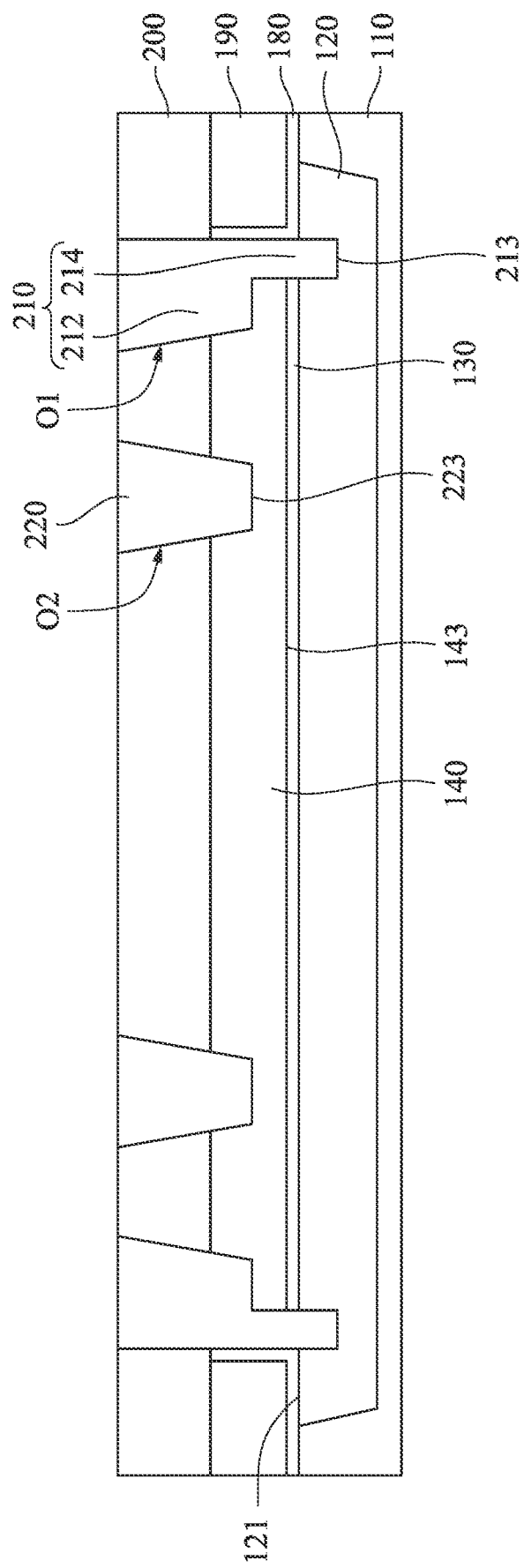
FIG. 13 is a cross-sectional view taking along line 13-13 of FIG. 12.

Reference is made to FIG. 12 and FIG. 13. FIG. 12 is a top view of a semiconductor device in accordance with some embodiments of the present disclosure, and FIG. 13 is a cross-sectional view taking along line 13-13 of FIG. 12. It is noted that the second ILD 200 is omitted in FIG. 12 for clarity. In FIG. 12 and FIG. 13, the semiconductor device includes the substrate 110, the isolation structure 120, the dielectric structure 130, the conductive structure 140, the CESL 180, the first ILD 190, the second ILD 200, the contact structures 210, and contact structures 220. The difference between the semiconductor device in FIG. 10 and the semiconductor device in FIG. 13 pertains to the conductive structure 140 having a larger width and thus have more space to accommodate the contact structure 220 disposed in the conductive structure 140 and the second ILD 200. As such, the contact resistance between the contact structures (contact structures 210 and contact structures 220) and the conductive structure 140 can be decreased. Materials, configurations, dimensions, processes and/or operations regarding the substrate 110, the isolation structure 120, the dielectric structure 130, the conductive structure 140, the CESL 180, the first ILD 190, the second ILD 200, and the contact structure 210 of FIG. 13 are similar to or the same as those of FIG. 9.

The formation of the contact structure 220 includes the following operations: forming an opening O2 in the second ILD 200 and the conductive structure 140; filling conductive material in the opening O2; and removing excess portions of the conductive material outside the opening O2 with a planarization process to form the contact structure 220. The formation process of the opening O2 can be performed in FIG. 8, and the filling and planarization processes can be performed in FIG. 9. That is, the openings O1 and O2 of the contact structures 210 and 220 can be etched in one etching process. Unlike the opening O1, which is formed by removing portions of the first and second spacer structures 160 and 170, the opening O2 is formed in the conductive structure 140 and is spaced apart from the first and second spacer structures 160 and 170. As such, the opening O2 does not extend to the bottom of the conductive structure 140 (see FIG. 13) due to slow etching rate.

In some embodiments, the contact structure 220 is adjacent to the contact structure 210. The contact structure 220 extends upwards from the conductive structure 140. The contact structure 220 is spaced apart from the dielectric structure 130 and the isolation structure 120. In some embodiments, a bottom surface 223 of the contact structure 220 is upper than a bottom surface 143 of the conductive structure 140. The bottom surface 223 of the contact structure 220 is upper than the bottom surface 213 of the contact structure 210. In some embodiments, the contact structure 220 has a profile similar to that of the top portion 212 of the contact structure 210. For example, the contact structure 220 has a trapezoid profile. In some embodiments, the bottom surface 223 of the contact structure 220 is substantially coplanar with a bottom surface of the top portion 212 of the contact structure 210.

Figure 14:
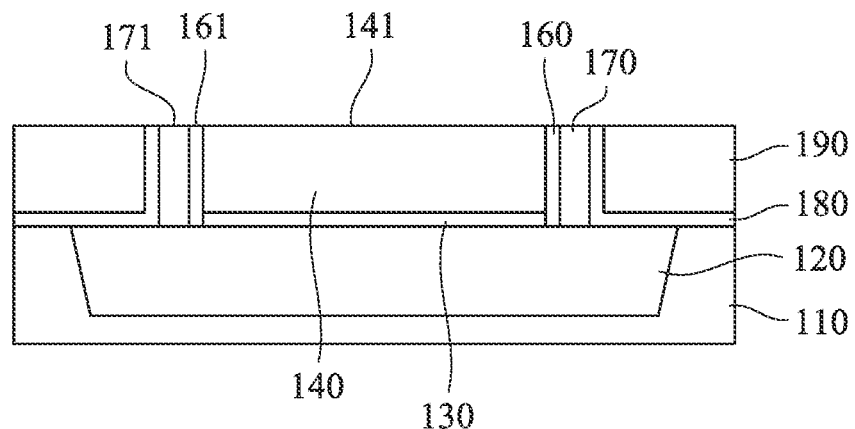
FIG. 14 to FIG. 19 illustrate a method for manufacturing a semiconductor device at various stages in accordance with some embodiments of the present disclosure.

FIG. 14 to FIG. 19 illustrate a method for manufacturing a semiconductor device at various stages in accordance with some embodiments of the present disclosure. Reference is made to FIG. 14. Similarly to FIG. 1 to FIG. 6, the isolation structure 120 is formed in the substrate 110. The dielectric structure 130 is formed over the isolation structure 120. The conductive structure 140 is formed over the dielectric structure 130. The first spacer structures 160 are formed at least on the opposite sidewalls of the conductive structure 140 and the dielectric structure 130. The second spacer structures 170 are formed on the opposite sidewalls of the first spacer structures 160. The top portions of the first spacer structures 160 and the second spacer structures 170 are etched such that the top surfaces 161 of the first spacer structures 160 and the top surfaces 171 of the second spacer structures 170 are substantially coplanar with the top surface 141 of the conductive structure 140. The contact etch stop layer (CESL) 180 is formed over the substrate 110, the isolation structure 120 and the sidewalls of the second spacer structures 170. The first interlayer dielectric (ILD) 190 is formed on the CESL 180. Materials, configurations, dimensions, processes and/or operations regarding the substrate 110, the isolation structure 120, the dielectric structure 130, the conductive structure 140, the first spacer structures 160, the second spacer structures 170, the CESL 180, and the first ILD 190 are respectively similar to or the same as the substrate 110, the isolation structure 120, the dielectric structure 130, the conductive structure 140, the first spacer structures 160, the second spacer structures 170, the CESL 180, and the first ILD 190 of FIG. 6.

Figure 15:
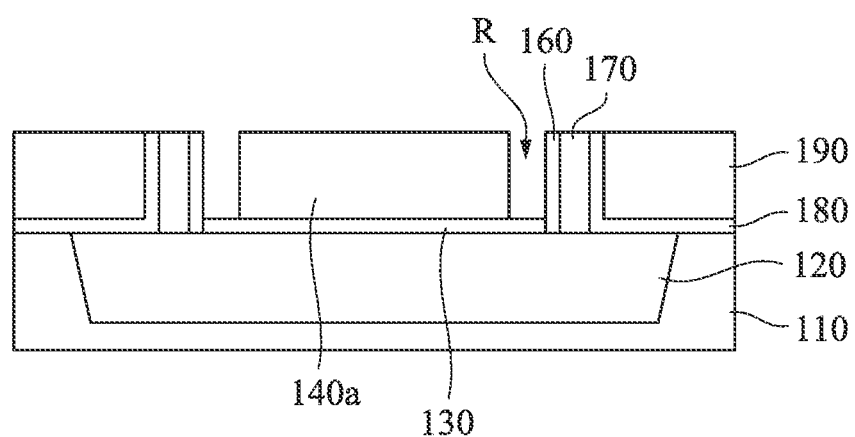

Reference is made to FIG. 14 and FIG. 15. An etching process is performed to form recesses R such that portions of the conductive structure 140 are removed. In some embodiments, the dielectric structure 130 is exposed through the recess R. In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$: $H_2O_2$:$H_2O$ (APM), $NH_2OH$, KOH, $HNO_3$:$NH_4F$:$H_2O$, and/or the like.

Figure 16:
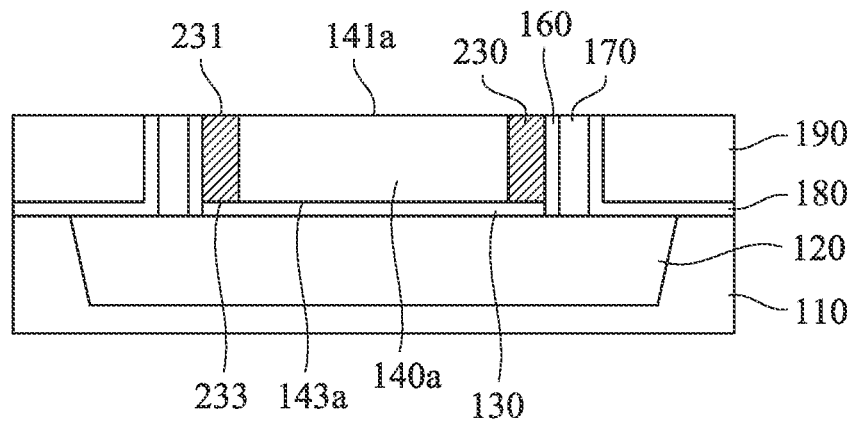

Reference is made to FIG. 15 and FIG. 16. A metal structure 230 (e.g., metal gate electrode in some cases) is formed in the recess R. The metal structure 230 may include a high-k dielectric layer, a work function metal layer, a fill layer, and/or other suitable layers that are desirable in a metal stack. The high-k dielectric layer of the metal structure 230 may include metal oxides, metal nitrides, metal silicates, transition metal-oxides, transition metal-nitrides, transition metal-silicates, oxynitrides of metals, metal aluminates, zirconium silicate, zirconium aluminate, $HfO_2$, or combinations thereof. The work function metal layer of the metal structure 230 may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal structure 230 is a p-type metal structure including a p-type work function metal layer. For example, the work function metal layer of the metal structure 230 is made of TaN or TiN. In some embodiments, the fill layer of the metal structure 230 may include aluminum (Al). The fill layer of the metal structure 230 may be deposited by ALD, PVD, CVD, or other suitable process.

In some embodiments, a capping layer is disposed between the work function metal layer and the fill layer of the metal structure 230. The capping layer may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like.

In some embodiments, since the size of the recess R (see FIG. 15) is small, the metal structure 230 may include a few of metal layers. That is, the recess R is filled when one or few metal layers (e.g., the high-k dielectric layer and the p-type work function layer) are deposited in the recess R, and the metal structure 230 may be free of aforementioned fill layer and/or other layers formed after the p-type work function layer. With such configuration, the metal (e.g., Al in fill metal) diffusion into the contact structure 240 (see FIG. 19) can be prevented or improved.

In some embodiments, the metal structure 230 is in contact with the dielectric structure 130. In some embodiments, the metal structure 230 is in contact with the conductive structure 140a and the first spacer structures 160. In some embodiments, a top surface 231 of the metal structure 230 is substantially coplanar with a top surface 141a of the conductive structure 140a, and a bottom surface 233 of the metal structure 230 is substantially coplanar with a bottom surface 143a of the conductive structure 140a.

Figure 17:
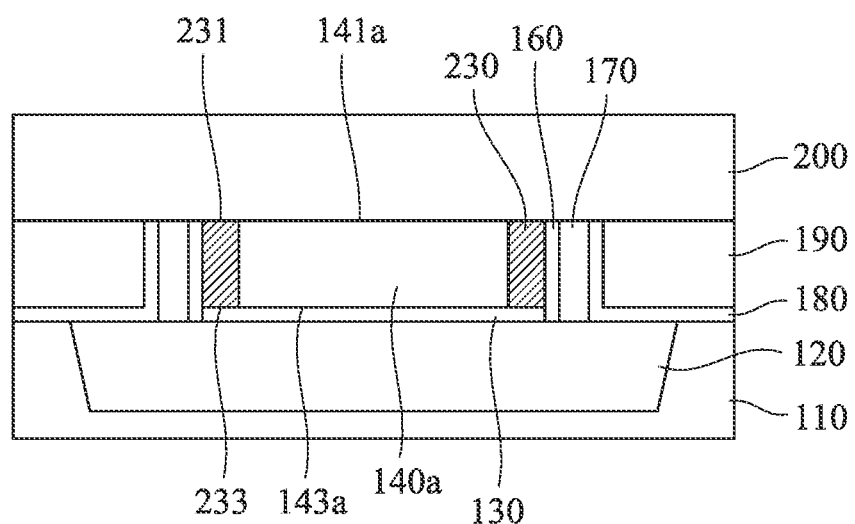

Reference is made to FIG. 17. The second ILD 200 is formed over the structure of FIG. 16. In other words, the second ILD 200 is formed over the conductive structure 140a, the first spacer structures 160, the second spacer structures 170, the CESL 180, the first ILD 190, and the metal structure 230. Materials, configurations, dimensions, processes and/or operations regarding the second ILD 200 is similar to or the same as the second ILD 200 of FIG. 7.

Figure 18:
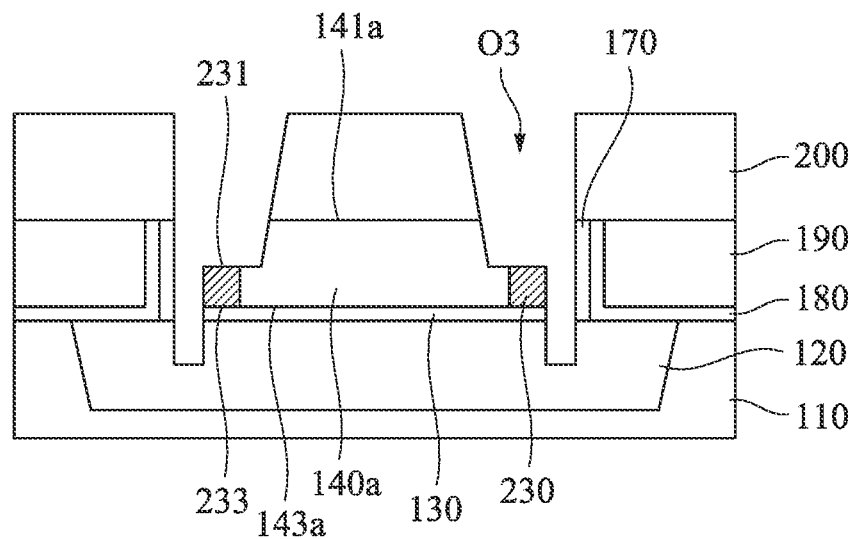

Reference is made to FIG. 18. An etching process is performed to form an opening O3 between the conductive structure 140a and the CESL 180 such that portions of the isolation structure 120, the dielectric structure 130, the conductive structure 140a, the second ILD 200, and the metal structure 230 are removed. In some embodiments, the first spacer structures 160 and a portion of the second spacer structures 170 are removed, while leaving the other portions of the second spacer structures 170 remained. In some other embodiments, the first spacer structures 160 and the second spacer structures 170 are removed such that the CESL 180 is exposed through the opening O3.

In some embodiments, the top surface 231 of the metal structure 230 is lower than the top surface 141a of the conductive structure 140a. In some embodiments, the top surface 231 of the metal structure 230 and a sidewall of the metal structure 230 adjacent to the second spacer structures 170 are exposed through the opening O3.

In some embodiments, the etching process is a selectively etching process. An etching rate of the conductive structure 140 is smaller than an etching rate of the first spacer structures 160 and the second spacer structures 170.

In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$:$H_2O_2$:$H_2O$ (APM), $NH_2OH$, KOH, $HNO_3$:$NH_4F$:$H_2O$, and/or the like.

Figure 19:
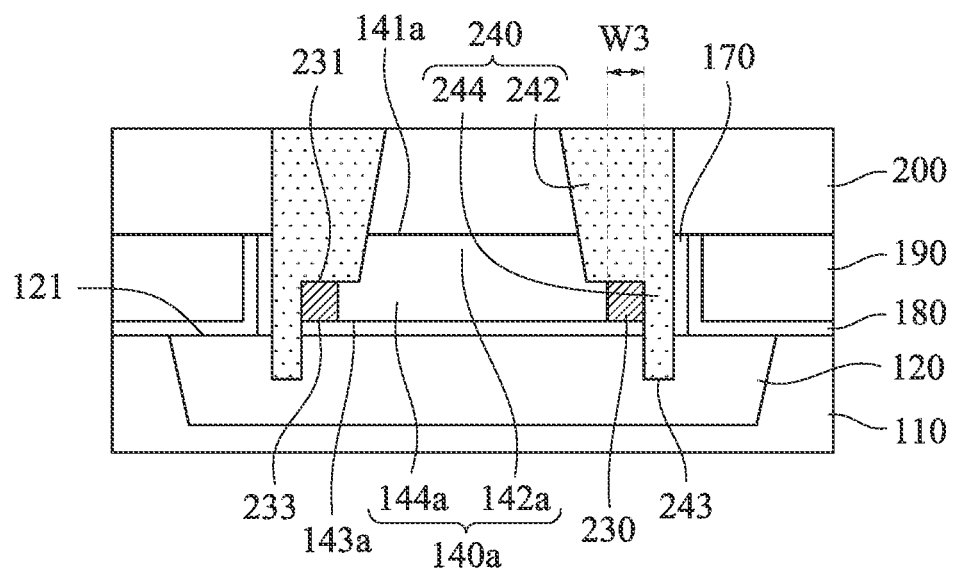
Figure 20:
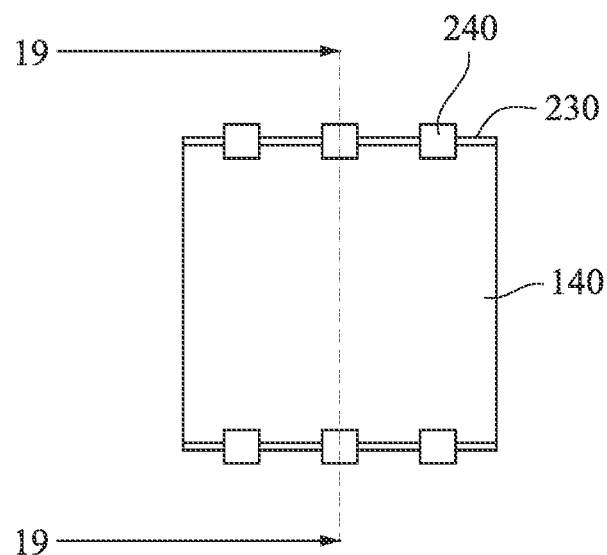
FIG. 20 is a top view of the semiconductor device in FIG. 19.

Reference is made to FIG. 18 to FIG. 20. FIG. 20 is a top view of the semiconductor device in FIG. 19, in which the second ILD 200 is omitted for clarity. In other words, FIG. 19 is a cross-sectional view taking along line 19-19 of FIG. 20. A conductive material is filled in the opening O3 to form contact structures 240. The contact structure 240 is electrically connected to the conductive structure 140a and the metal structure 230. In some embodiments, the contact structure 240 may be made of metal, such as W, Co, Ru, Al, Cu, or other suitable materials. After the deposition of the contact structure 240, a planarization process, such as a chemical mechanical planarization (CMP) process, may be then performed. In some embodiments, the contact structure 240 extends upwards from the isolation structure 120 and is formed in the isolation structure 120 and the second ILD 200. The contact structure 240 has a top portion 242 in contact with the second ILD 200 and the bottom portion 244 in contact with the dielectric structure 130 and the isolation structure 120. As such, the contact area between the contact structure 240 and the conductive structure 140a can be increased and thus the contact resistance between the contact structure 240 and the conductive structure 140 can be decreased, thereby improving the performance of the semiconductor device. In some embodiments, a width the top portion 242 of the contact structure 240 is greater than a width of the bottom portion 244 of the contact structure 240. In some embodiments, an area of the top portion 242 of the contact structure 240 is greater than an area of the bottom portion 244 of the contact structure 240.

In some embodiments, since the first spacer structures 160 (see FIG. 17) are removed by the etching process, the contact structure 240 is in contact with the second spacer structures 170. The contact structure 240 is separated from the CESL 180 by the second spacer structures 170.

In some embodiments, the semiconductor device in FIG. 19 and FIG. 20 includes the substrate 110, the isolation structure 120, the conductive structure 140a, the metal structure 230 and the contact structure 240. The isolation structure 120 is disposed in the substrate 110. The conductive structure 140a is disposed on the isolation structure 120. The metal structure 230 is disposed on the isolation structure 120 and adjacent to the conductive structure 140a. The contact structure 240 extends upwards from the isolation structure 120.

In some embodiments, a top surface 121 of the isolation structure 120 is substantially coplanar with a top surface of the substrate 110. In some embodiments, the conductive structure 140a has a top portion 142a and a bottom portion 144a, in which a width of the top portion 142a is smaller than a width of the bottom portion 144a. In some embodiments, the contact structure 240 has a top portion 242 on the conductive structure 140a and a bottom portion 244 in the isolation structure 120. The bottom portion 144a of the conductive structure 140a is separated from the bottom portion 244 of the contact structure 240 by the metal structure 230. The top portion 242 of the contact structure 240 has a different profile from that of the bottom portion 244 of the contact structure 240. For example, the top portion 242 of the contact structure 240 has a trapezoid profile, while the bottom portion 244 of the contact structure 240 has a rectangle profile. A width of the top portion 242 of the contact structure 240 is greater than a width of the bottom portion 244 of the contact structure 240. The top portion 242 of the contact structure 240 is in contact with the conductive structure 140a, and the bottom portion 244 of the contact structure 240 is in contact with the metal structure 230 and the dielectric structure 130. In some embodiments, a bottom surface 243 of the contact structure 240 is lower than the top surface 121 of the isolation structure 120. In some embodiments, the bottom surface 243 of the contact structure 240 is lower than the bottom surface 233 of the metal structure 230.

In some embodiments, a width W3 of the metal structure 230 is smaller than about 40 nm. In some other embodiments, the width W3 of the metal structure 230 is smaller than 20 nm. As such, the diffuse problem between the metal structure 230 (e.g., Aluminum) and the contact structure 240 can be ignored or prevented as explained above.

In some embodiments, the semiconductor device further includes the dielectric structure 130 between the conductive structure 140a and the isolation structure 120. A width of the dielectric structure 130 is equal to a combination of a width of the bottom portion 144a of the conductive structure 140a and the width W3 of the metal structure 230. In some embodiments, the bottom portion 244 of the contact structure 240 is in contact with the dielectric structure 130.

In some embodiments, the semiconductor device further includes the CESL 180 on the top surface 121 of the isolation structure and on the sidewall of the second spacer structures 170 farthest away from the metal structure 230. The CESL 180 is separated from the contact structure 210 by the second spacer structures 170.

In some embodiments, the semiconductor device further includes the first ILD 190 on the CESL 180. A top surface of first ILD 190 is substantially coplanar with a top surface of the conductive structure 140a. In some embodiments, the semiconductor device further includes the second ILD 200 on the conductive structure 140a and the first ILD 190. The second ILD 200 surrounds the top portion 242 of the contact structure 240. A top surface of the second ILD 200 is substantially coplanar with a top surface of the contact structure 240.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the configuration of the contact structure is beneficial to increase the contact area between the contact structure and the conductive structure. Furthermore, the contact resistance can be decreased and thus the performance of the semiconductor device can be improved. Another advantage is that no additional process, which would increase the manufacture cost, is included in the method for manufacturing the semiconductor device. For example, the formation of the conductive structure can be compatible with dummy gate structure of transistors, and the formation of the metal structure can be compatible with high-k metal gate structure of transistors. Further, retention and read disturb at high temperature can be improved.

According to some embodiments, a semiconductor device includes a substrate, an isolation structure, a conductive structure, and a first contact structure. The isolation structure is disposed in the substrate. The conductive structure is disposed on the isolation structure. The conductive structure extends upwards from the isolation structure, in which the first contact structure has a top portion on the conductive structure and a bottom portion in contact with the isolation structure.

According to some embodiments, a semiconductor device includes a substrate, an isolation structure, a conductive structure, a metal structure, and a contact structure. The isolation structure is disposed in the substrate. The conductive structure is disposed on the isolation structure. The metal structure is disposed on the isolation structure and adjacent to the conductive structure. The contact structure electrically connected to the metal structure, in which a bottom surface of the contact structure is lower than a bottom surface of the metal structure.

According to some embodiments, a method for manufacturing a semiconductor device includes forming an isolation structure in a substrate. A conductive structure is formed over the isolation structure. The isolation structure and the conductive structure are etched to form an opening. A conductive material is filled in the opening to form a contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming an isolation structure in a substrate;
forming a conductive structure over the isolation structure;
forming an interlayer dielectric over the conductive structure;
etching the interlayer dielectric to form a first opening, wherein the first opening exposes the conductive structure and the isolation structure; and
filling a conductive material in the first opening to form a first contact structure.

2. The method of claim 1, further comprising:
etching the interlayer dielectric to form a second opening, wherein the second opening exposes the conductive structure, and filling the conductive material in the first opening is performed such that the second opening is filled with the conductive material to form a second contact structure.

3. The method of claim 2, wherein the second contact structure is spaced apart from the isolation structure.

4. The method of claim 2, wherein etching the interlayer dielectric to form the second opening comprises etching the conductive structure.

5. The method of claim 2, wherein a bottom surface of the first contact structure is lower than a bottom surface of the second contact structure.

6. The method of claim 2, wherein etching the interlayer dielectric to form the first opening and etching the interlayer dielectric to form the second opening are performed at least partially simultaneously.

7. The method of claim 1, wherein etching the interlayer dielectric to form the first opening comprises etching the conductive structure and the isolation structure.

8. The method of claim 1, further comprising:
forming a dielectric structure over the isolation structure prior to forming the conductive structure, wherein etching the interlayer dielectric to form the first opening comprises etching the dielectric structure.

9. The method of claim 1, wherein the first contact structure has a top portion over the conductive structure and a bottom portion in the isolation structure.

10. A method, comprising:
forming an isolation structure in a substrate;
forming a polycrystalline structure over the isolation structure;
forming an interlayer dielectric over the polycrystalline structure;
etching a first opening extending through the interlayer dielectric, the polycrystalline structure into the isolation structure; and
forming a first contact structure in the first opening.

11. The method of claim 10, further comprising:
etching a second opening extending through the interlayer dielectric into the polycrystalline structure; and
forming a second contact structure in the second opening.

12. The method of claim 11, wherein the second contact structure has a height less than a height of the first contact structure.

13. The method of claim 11, wherein the second contact structure has a bottom surface in contact with the polycrystalline structure.

14. The method of claim 10, wherein the first contact structure has a bottom surface in contact with the isolation structure.

15. The method of claim 10, wherein the first contact structure has a linear sidewall and a non-linear sidewall opposing the linear sidewall.

16. The method of claim 15, wherein the non-linear sidewall is a stepped sidewall.

17. A method, comprising:
forming a polysilicon structure over a shallow trench isolation (STI) region;
forming an interlayer dielectric over the polysilicon structure;
forming a plurality of first openings each extending through the interlayer dielectric and the polysilicon structure, the plurality of first openings being spaced apart at least by the polysilicon structure; and
forming a plurality of first contact structures in the plurality of first openings, respectively.

18. The method of claim 17, wherein the plurality of first openings further extend into the STI region.

19. The method of claim 17, further comprising:
forming a plurality of second openings each extending through the interlayer dielectric to expose the polysilicon structure; and
forming a plurality of second contact structures in the plurality of second openings, respectively.

20. The method of claim 19, wherein the plurality of second contact structures are between the plurality of first contact structures.

* * * * *